(12) United States Patent
Tan et al.

(10) Patent No.: US 6,812,688 B2
(45) Date of Patent: Nov. 2, 2004

(54) SIGNAL ACQUISITION METHOD AND APPARATUS USING INTEGRATED PHASE LOCKED LOOP

(75) Inventors: Kan Tan, Beaverton, OR (US); Benjamin A. Ward, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 126 days.

(21) Appl. No.: 10/316,630

(22) Filed: Dec. 10, 2002

(65) Prior Publication Data

US 2003/0128021 A1 Jul. 10, 2003

Related U.S. Application Data

(60) Provisional application No. 60/340,766, filed on Dec. 12, 2001.

(51) Int. Cl.[7] .............................................. G01R 13/20
(52) U.S. Cl. .................... 324/121 R; 324/719; 324/765
(58) Field of Search ................................. 324/121, 713, 324/716, 719, 763, 765, 769, 537, 438; 438/14, 17; 365/185.09, 201

(56) References Cited

U.S. PATENT DOCUMENTS 5,793,212 A * 8/1998 Om .............................. 324/537
6,049,213 A * 4/2000 Abadeer ....................... 324/719

* cited by examiner

*Primary Examiner*—David A. Zarneke
*Assistant Examiner*—Trung Q Nguyen
(74) *Attorney, Agent, or Firm*—Moser, Patterson & Sheridan, LLP; Thomas F. Lenihan

(57) ABSTRACT

A test and measurement apparatus and method wherein a software implemented phase lock loop recovers a clock signal associated with the received data signal, the recovered clock signal being used to do TIE measurement, to generate eye diagram and to do mask testing.

7 Claims, 3 Drawing Sheets

SIGNAL ACQUISITION METHOD AND APPARATUS USING INTEGRATED PHASE LOCKED LOOP

CROSS REFERENCE TO RELATED APPLICATIONS

This application claims the benefit of commonly owned provisional patent application Ser. No. 60/340,766, filed Dec. 12, 2001, which is hereby incorporated by reference in its entirety.

FIELD OF THE INVENTION

The invention relates generally to signal analysis instruments and, more specifically, to a method and apparatus providing enhanced data communications measurements.

BACKGROUND OF THE INVENTION

Signal acquisition devices such as digital storage oscilloscopes (DSOs) and the like are commonly used for a variety of timing measurements during the testing of telecommunications and data communications (telecom/datacom) SIGNALS. Common tests performed on telecom/datacom signals include the generation of eye diagrams, mask testing and time interval error (TIE) testing. These tests are performed using dedicated hardware and software within the DSO. If the data/clock signals are accurate, then the tests work well.

An eye diagram is a visual overlay of multiple data symbols that are aligned in time on a display device. Mask tests are similar to eye diagrams where only selected bit sequences are overlaid. Eye diagrams and mask tests contemporaneously display multiple short waveform segments. Typically, the time alignment for each segment comes from triggering on a data signal edge. The TIE test is a skew (i.e., delay) measurement between the edges of the sampled signal (i.e., clock or data signal) and the edges of a reference signal (i.e., data or clock signal). TIE is typically a measurement made on real-time acquisitions, and reference clock or data edges come from a "best fit" calculation of an ideal clock derived from the sampled signal.

A useful reference signal for many telecom-timing measurements is the recovered clock from a Phase-Locked Loop (PLL). Many telecom/datacom standards (e.g., FibreChannel) utilize PLL clock/data recovery as part of the specifications. Since the recovered clock/data is used as the ideal clock/data in telecom/datacom implementations, timing errors (i.e., Jitter) relative to the recovered clock are more appropriate than timing errors relative to some other reference. A recovered clock signal from an external hardware PLL clock/data recovery circuit may be used to trigger the acquisition and display (e.g., eye diagram generation) of data received via a first oscilloscope input channel as well as be used as reference clock signal for TIE measurement (via input of the clock signal input to a second oscilloscope input channel). Internal hardware PLL clock/data recovery circuit has been implemented for trigger, but not suitable for TIE measurements since the recovered clock is not recorded.

SUMMARY OF INVENTION

These and other deficiencies of the prior art are addressed by the present invention of a method and apparatus for recovering a clock component of a data signal using a phase locked loop to a test and measurement device.

Specifically, an apparatus according to one embodiment of the invention comprises an acquisition unit, for acquiring at least a portion of a data signal in response to a trigger signal and providing therefrom an acquired sample stream; a controller, including a memory for storing a phase locked loop (PLL) program, a processor for executing the PLL program, and an input/output (I/O) circuit or program interface for receiving the acquired sample stream for use by the PLL programs and responsively providing a clock signal recovered using the PLL program.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

The subject invention will be primarily described within the context of test and measurement devices such as digital storage oscilloscopes (DSOs). However, it will be appreciated by those skilled in the art that the invention may be advantageously employed in any environment processing a signal having a clock or data component that is recoverable using a phase locked loop.

Within the context of a test and measurement instrument, part of the invention resides in the recognition by the inventors recognized that a software phase lock loop may be implemented to perform the functions described above. Another part of the invention resides in an enhancement to an internal hardware PLL embodiment wherein the recovered clock generated from the internal hardware PLL is recorded and, thus, usable for TIE measurements.

Figure 1:
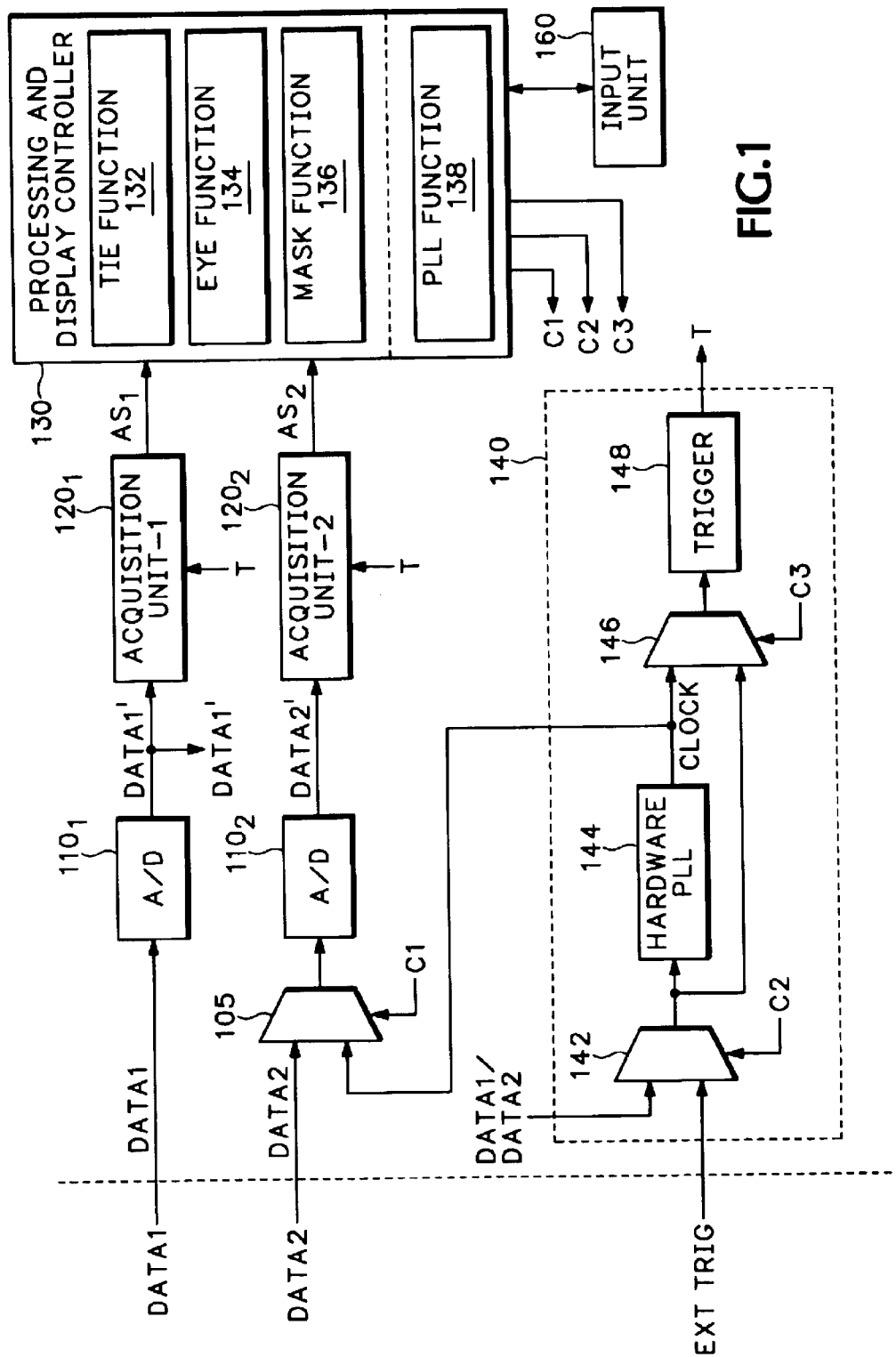
FIG. 1 depicts a high level block diagram of a signal acquisition system according to an embodiment of the present invention.

FIG. 1 depicts a high level block diagram of a signal acquisition system according to an embodiment of the present invention. Specifically, the system 100 of FIG. 1 depicts portions of a digital storage oscilloscope (DSO) including portions relevant to the present invention. Those portions not specifically represented in FIG. 1 (e.g., additional channels and the like) may readily be incorporated into the system 100 of FIG. 1 by those skilled in the art and informed by the teachings of the present invention.

The system 100 of FIG. 1 comprises, in part, a first analog-to-digital (A/D) converter $110_1$, a first acquisition unit $120_1$, a processing and display controller 130, a trigger circuit 140 and an input unit 160.

The first A/D converter $110_1$ receives a data signal DATA1 and responsively produces a digitized data signal DATA1' which is coupled to the first acquisition unit 120. The first acquisition unit $120_1$ comprises, illustratively, at least one decimator as well as supporting acquisition memory. The first acquisition unit $120_1$ is responsive to a trigger signal T to acquire at least portions of the digitized signal DATA1', which portions are then provided to the processing and display controller 130 as a first acquired sample stream $AS_1$.

The processing and display controller 130 comprises, illustratively, a display device (not shown) and associated data processing circuitry suitable for converting the acquired sample streams into visual imagery. The processing and display unit 130 may contemporaneously display a first vector or raster associated with the data signal acquired by the acquisition unit 120, and a second vector or raster associated with a clock signal and use such displayed data to achieve a desired testing purpose.

The processing and display unit 130 is responsive to the input unit 160 to set various parameters such as volts per division, time scale and the like. The processing and display unit 130 includes a time interval error (TIE) testing function 132, an eye generation function 134 and a mask testing function 136. The TIE function 132 operates to use both acquired data and recovered clock to realize a TIE testing function. The eye diagram generation function 134 operates to generate eye diagrams using the data and clock components of the received data signal DATA. The mask testing function 136 operates to generate an eye diagram representing a selected bit sequence. Other testing and display functions may also be implemented.

The processing and display unit 130 also includes a software implemented phase locked loop (PLL) function 138. The PLL function 138 recovers from the acquired sample stream $AS_1$ a clock signal associated with that sample stream. The clock signal is used by the various testing and display functions as appropriate.

The input unit 160 comprises a keypad, a pointing device or other means adapted to provide user input to the controller 150. The controller 150, in response to such user input, adapts the operations of the data acquisition unit(s) 120 to perform various data acquisition, triggering, processing, display and other functions. In addition, user input may be used to trigger automatic calibration functions and/or adapt other operating parameters.

The trigger circuit 140 operates to produce the trigger signal T that is used by the first acquisition unit $120_1$ to enable acquisition of at least portions of the digitized data signal DATA1'.

The portions of FIG. 1 thus far described comprise those system functions associated with a first embodiment of the invention; namely, the use of a software phase lock loop (PLL) function executed within the controller 130 to generate a clock signal based upon a received and digitized data signal to enable thereby various test and measurement functions to be performed. Various test, measurement and display functions associated with this and other embodiments will be described in more detail below with respect to FIGS. 2–4.

In one embodiment, the trigger circuit 140 recovers from the input data signal DATA1 (or a second input signal DATA2) a clock signal that is subsequently used as the trigger signal T. This clock signal may be generated using a hardware implementation of a PLL within the trigger circuit itself. The recovered clock generated from internal hardware PLL circuit is optionally recorded by a second acquisition unit $120_1$ for post processing operations such as eye diagram generation, mask diagram generation and as reference signal for TIE measurements.

Specifically, in various embodiments of the invention, the system 100 of FIG. 1 further comprises a second channel input select switch 105, a second A/D converter $110_2$ and a second acquisition unit $120_2$. The second channel input select switch 105, in response to a control signal C1 produced by the controller 130, couples one of a second input data signal DATA2 and the clock recovered by a PLL within the trigger circuit 140 to the second A/D converter $110_2$. The second AND converter $110_2$ responsively produces a digitized data signal DATA2' which is coupled to the second acquisition unit $120_2$. The second acquisition unit $120_2$ comprises, illustratively, at least one decimator as well as supporting acquisition memory. The second acquisition unit $120_2$ is responsive to the trigger signal T to acquire at least portions of the digitized signal DATA2', which portions are then provided to the processing and display controller 130 as a second acquired sample stream $AS_2$.

Where the first acquired sample stream AS, comprises the data signal DATA1' and the second acquired sample stream $AS_2$ comprises the clock signal CLOCK, the controller 130 responsively uses these acquired sample streams to perform any of the various testing and display functions as described herein.

The trigger circuit 140 comprises, in one embodiment, a first trigger select switch 142, a hardware PLL 144, a second trigger select switch 146 and a trigger module 148. The first trigger select switch 142, in response to a control signal C2 produced by the controller 130, couples one of an external trigger signal EXT TRIG and the first input data signal DATA1 (or second input data signal DATA2) to the hardware PLL 144 and to an input of the second trigger select switch 146. The hardware PLL 144 operates to generate a clock signal in response to the data signal DATA1 or external trigger signal EXT TRIG. The resulting clock signal is coupled to an input of the second trigger select switch 146 and channel input switch 105. The second trigger select switch 146, in response to a control signal C3 produced by the controller 130, couples one of its input signals to the trigger module 148, which responsively produces the trigger signal T that is coupled to one or both of the first $120_1$ and second $120_2$ acquisition units.

The trigger module 148 optionally operates in one or more of a plurality of operating modes. In one mode, the trigger module 148 comprises analog trigger circuitry and is responsive to an analog input signal, such as the input data signal DATA. In another mode, the trigger module 148 comprises digital trigger circuitry and is responsive to a digital input signal, such as the digitized input data signal DATA1' (or second digitized data signal DATA2'). In any mode (or combination thereof), the trigger circuit 140 may be responsive to or implement the PLL function 144.

It will be appreciated by those skilled in the art that standard signal processing components (not shown) such as signal buffering circuitry, signal delay or conditioning circuitry and the like are also employed as appropriate to enable the various functions described herein. For example, the A/D converter 110 samples its analog input stream at a sufficiently high rate to enable appropriate processing by the acquisition unit 120.

The system 100 of FIG. 1 is especially well adapted to accept a data or communications signal which has associated with it a clock signal that may be extracted using a phase lock loop (PLL) clock recovery technique. Such communications signals may comprise, illustratively, data signals conforming to a telecommunications and/or data communications standard such as, for example, the fiber channel standard and other serial data transform standards.

Figure 2:
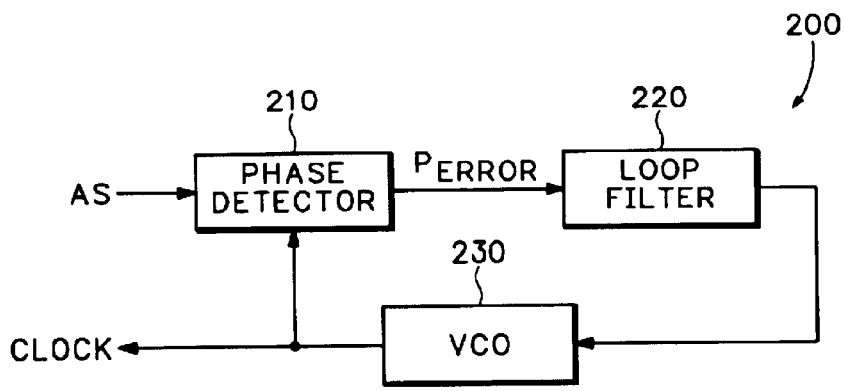
FIG. 2 depicts a high-level block diagram of a phase locked loop (PLL) suitable for use in the present invention.

FIG. 2 depicts a high level block diagram of a phase lock loop (PLL) suitable for use in the present invention. The PLL 200 of FIG. 2 comprises a functional diagram that is implemented as a software PLL (SWPLL) within the processing and display unit 130 or as hardware (HWPLL) within the hardware PLL 144. Briefly, an edge indicative signal such as acquired sample stream AS is applied to a phase detector 210 along with a recovered clock signal. The phase detector 210 detects signal edges and, in response to phase differences between the applied data signal AS and a recovered clock signal CLOCK, produces a phase error indicative signal $P_{ERROR}$. A loop filter 220 filters the phase error indicative signal $P_{ERROR}$ to responsively produce an output signal indicative of the magnitude of the phase error (and smoothed in time to avoid spurious phase adjustments). The filtered phase error signal is applied to a voltage controlled oscillator (VCO or virtual VCO such as a clock generator) 230, which produces at its output the recovered clock signal CLOCK provided to the phase detector 210. As the phase error increases in magnitude, the magnitude of error indicated by the loop filter increases and the oscillatory output of the VCO/clock generator 230 changes in a manner tending to reduce the detected phase error $P_{ERROR}$. The reduction of phase error is determined by bandwidth and other parameters of the PLL. In this manner, the recovered clock signal CLOCK is locked in phase to the received data signal AS and represents a clock signal associated with the received data signal.

Figure 3:
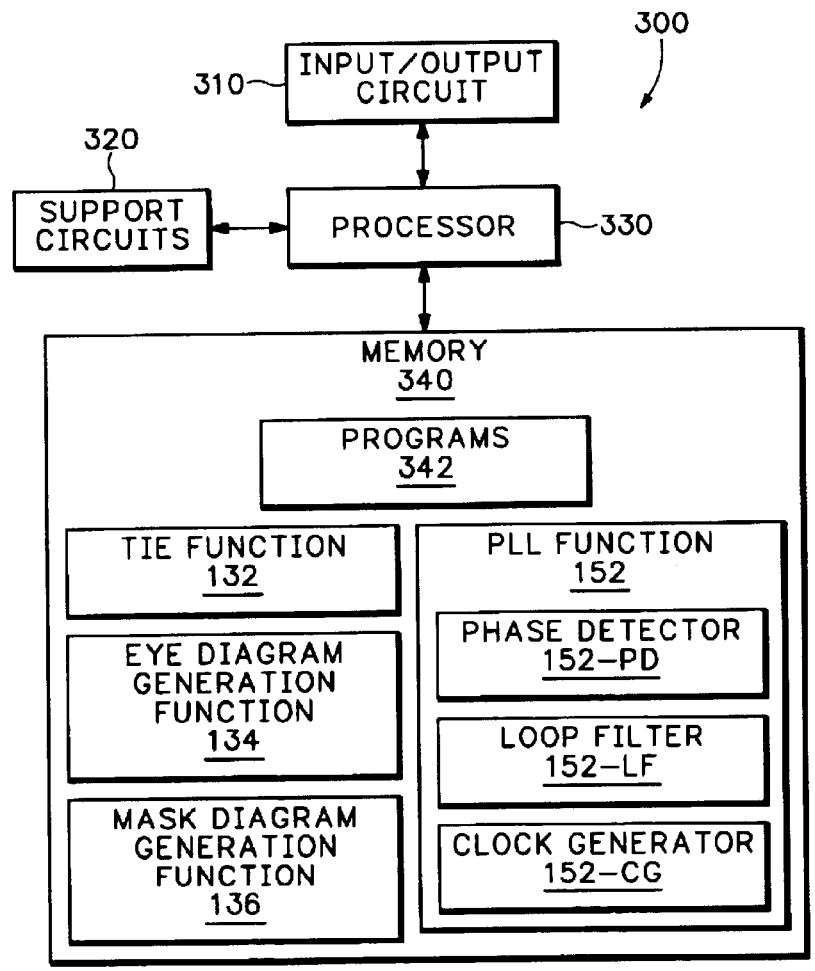
FIG. 3 depicts a high level block diagram of a controller suitable for use in the signal analysis system of FIG. 1.

FIG. 3 depicts a high level block diagram of a control circuit suitable for use in the signal analysis system of FIG. 1. Specifically, the control circuit 300 of FIG. 3 may be employed to implement the processing and display unit 130.

The control circuit 300 of FIG. 3 comprises a processor 330 as well as memory 340 for storing various control programs and other programs 342. The processor 330 cooperates with conventional support circuitry 320 such as power supplies, clock circuits, cache memory and the like as well as circuits that assist in executing the software routines stored in the memory 340. As such, it is contemplated that some of the steps discussed herein as software processes may be implemented within hardware, for example as circuitry that cooperates with the processor 330 to perform various steps. The control circuit 300 also contains input/output (I/O) circuitry 310 that forms an interface between the various functional elements communicating with the function implemented using the control circuit 300.

Although the control circuit 300 of FIG. 3 is depicted as a general-purpose computer that is programmed to perform various control functions in accordance with the present invention, the invention can be implemented in hardware as, for example, an application specific integrated circuit (ASIC), or a field programmable gate array (FPGA). As such, the process steps described herein are intended to be broadly interpreted as being equivalently performed by software, hardware, or a combination thereof.

The memory 340 is used to store the software instructions necessary to implement the PLL function 132. In this embodiment of controller 130, the I/O circuit 310 receives the acquired sample stream $AS_1$ and responsively produces a software derived clock signal CLOCK which is used to perform various test, measurement and display functions. It is noted that appropriate delay and/or sequencing is provided to ensure that the processing delay incurred by the acquisition unit $120_1$ is compensated for, thereby allowing the display of temporally aligned data and clock signals.

Specifically, a phase detector program 152-PD implements a phase detection function, a loop filter program 152-LF implements a loop filter function and a clock generator function 152-CG implements a clock generation (virtual PLL voltage controlled oscillator (VCO)) function as discussed above with respect to FIG. 2. The phase detector program 152-PD is a software module that produces an output word or quantity having a magnitude proportional to the phase difference between its two input words or quantities. The phase detector program 152-PD may also function as a phase/frequency detector. The loop filter program 152-LF can be realized as, illustratively, an active proportional plus integral (PI) filter. In this realization, given a desired bandwidth the parameters of a corresponding PI filter may be readily determined as known to those skilled in the art. The clock generator function 152-CG comprises, illustratively, a sine wave generator, square wave or other function generator. A starting frequency and phase of a sine wave generated thereby can be based on explicit input from a user, a calculation of a best fitting slope (frequency) an offset (phase) to the edge times of an input clock and the like. The data and recovered clock signals/words are normalized for use by the phase detector program 152-PD such that the resulting calculated phase error signal/word is appropriate.

The memory 340 as shown also includes at least the software instructions necessary for executing the TIE function 132, eye diagram generation function 134 and mask testing function 136. In this embodiment of processing and display unit 130, the I/O circuit 310 utilizes the recovered clock signal CLOCK and the acquired sample stream $AS_1$ and responsively produces the imagery associated with the TIE function 132, eye diagram generation function 134 and mask testing function 136.

The time interval error (TIE) testing function 132 is a skew (i.e., delay) measurement between the edges of the acquired signal AS and the edges of the clock signal CLOCK retrieved via the software PLL function 152. The TIE function may be implemented in a known manner by those skilled in the art.

The eye diagram generation function 134 is implemented according to a software routine (unlike existing hardware implementations) that generates a visual overlay of multiple data symbols that are aligned in time on the display device. Briefly, the acquired samples stream AS is sliced into a sequence of frames using the clock signal CLOCK produced by the PLL function 152. The frames are stored in display memory in a frame-aligned manner to form thereby an eye diagram on the display device. The mask testing function 136 is implemented in a manner similar to that described for the eye diagram function 134, except that only selected bit sequences are overlaid.

Figure 4:
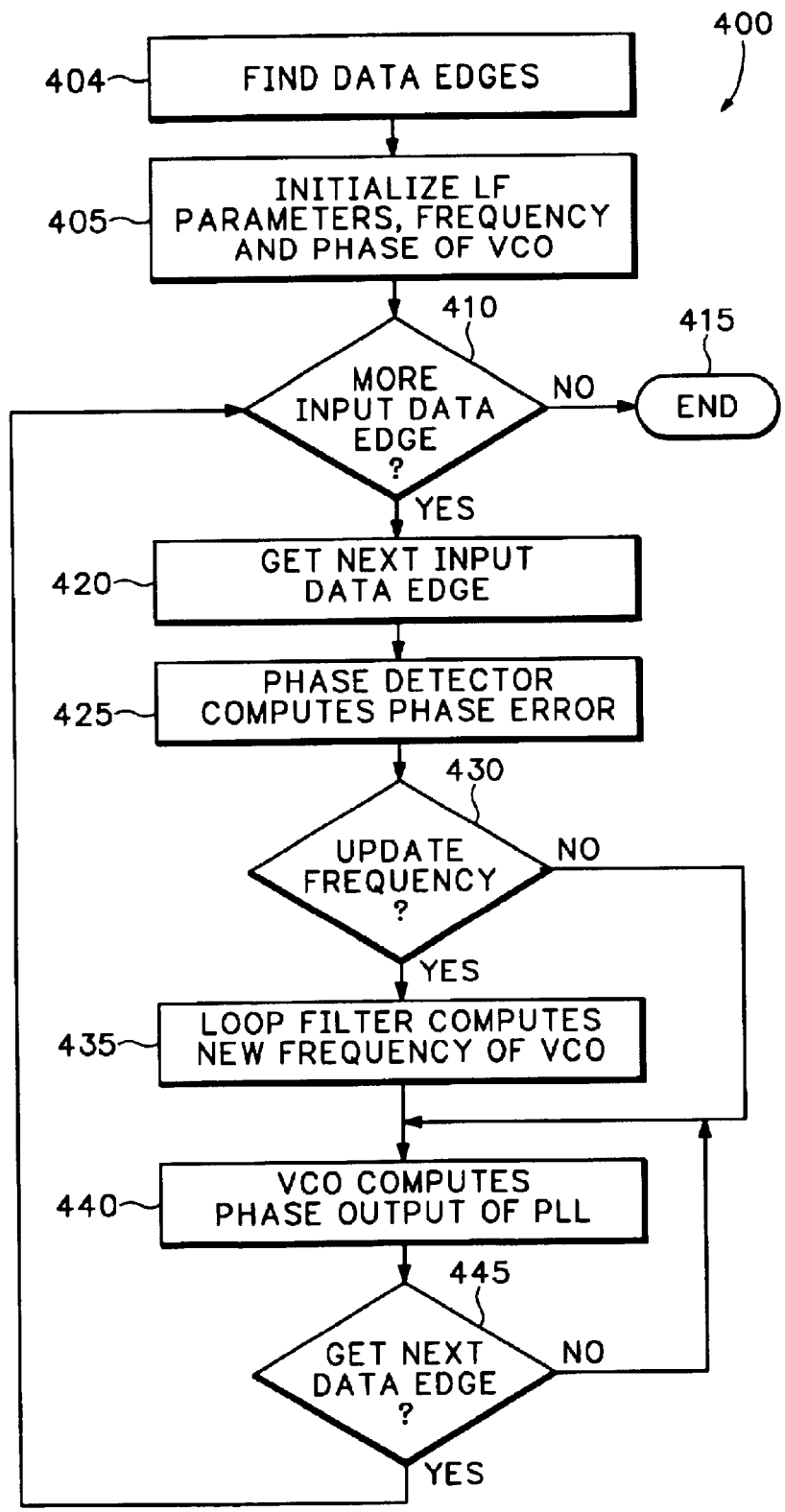
FIG. 4 depicts a flow diagram of a method according to an embodiment of the invention.

FIG. 4 depicts a flow diagram of a method according to an embodiment of the invention. Specifically, the method 400 of FIG. 4 implements the software phase lock loop embodiment discussed above. The method 400 is entered at step 404, where the data edges within the acquired sample stream AS are determined. At step 405, the loop filter parameters, frequency and phase parameters of the VCO function are initialized. At step 410, a determination is made as to whether more input data edges are to be received. If the query is answered negatively, the method 400 is exited at step 415. Otherwise, at step 420 the next input data edge is retrieved. That is, at step 420, the control circuit 300 determines that an input data edge on the received data signal $DATA_1'$ is present.

At step 425, the phase detector function 152-PD computes a phase error. It is noted that the phase error computed assumes that a clock has been previously recovered by the clock change program 152-CC.

At step 430, a determination is made as to whether the frequency should be updated. That is, at step 430 the phase error computed by the phase detector function 152-PD is used to determine whether the output clock signal CLOCK generated by the controller (e.g., by toggling an output port signal or via a programmable timer or function generator such as a sine wave or square wave generator) should be adjusted in frequency. If such adjustment should be made, then the loop filter function 152-LF computes a new output frequency of an output signal provided by the controller. The controller output signal represents the clock signal CLOCK and is generated by toggling an output port bit, providing an output of a programmable timer or the like.

At step 440, the clock change function 152-CC computes the phase and/or frequency output of the virtual VCO. At step 445, a determination is made as to whether the next data edge should be retrieved. If the query at step 445 is answered negatively, then the method 400 repeats at step 440. Otherwise, the method 400 proceeds to step 410.

It will be appreciated by those skilled in the art that the above-described SW-PLL is depicted as operating in a substantially "in lock" condition. Prior to achieving the in lock condition the method 400 operates in a clock acquisition mode wherein the SW-PLL output is not representative of a recovered clock signal. Upon achieving the in lock condition, the SW-PLL output does represent the recovered clock signal and is useful as the clock signal CLOCK in the above embodiments of the invention.

The SW-PLL of the present invention embodiment (in comparison to a hardware PLL) advantageously provides increased flexibility, since the various PLL parameters may be readily changed in software. Moreover, a higher loop bandwidth is achieved since the highest data rate limit depends upon the scope acquisition bandwidth, not the bandwidth of a hardware based PLL. In one embodiment, the SW-PLL works on single acquisitions, so trigger jitter is automatically avoided. The SW-PLL embodiment also avoids the channel-to-channel sample jitter problem since there is no requirement for a second channel and, therefore, no additional jitter source. The SW-PLL is not affected by temperature change and power supply change as hardware PLL does. Finally, since the SWPLL configuration may perform more sophisticated computing operations and use more precise data representations, greater accuracy is achieved. These advantages are gained at the expense of slower processing speed (the SWPLL requires post processing) and increased memory requirements. These embodiments will now be discussed in more detail.

While the foregoing is directed to the preferred embodiment of the present invention, other and further embodiments of the invention may be devised without departing from the basic scope thereof, and the scope thereof is determined by the claims that follow.

What is claimed is:
1. An oscilloscope, comprising:
   an analog to digital (A/D) converter for digitizing a data signal;
   an acquisition unit, for acquiring at least a portion of a digitized data signal in response to a trigger signal;
   a phase locked loop (PLL), implemented in software for recovering a clock signal from said data signal;
   a processor having a memory, said processor executing said PLL software and storing said recovered clock signals in said memory;
   and a display device, for contemporaneously displaying said data signal and said clock signal.
2. The oscilloscope of claim 1, wherein a difference between said data signal and corresponding recovered clock signal is displayed on said display device as a Time Interval Error (TIE) function.
3. The oscilloscope of claim 1, wherein a trigger signal is generated in response to said recovered clock signal.
4. The apparatus of claim 1, wherein said memory further stores an eye diagram generation program operative to segment said acquired sample stream into a plurality of frames according to said recovered clock signal and store said frames in a display memory.
5. The apparatus of claim 1, wherein said memory further stores an mask diagram generation program operative to segment said acquired sample stream into a plurality of selected bit sequences according to said recovered clock signal and store said bit sequences in a display memory.
6. An oscilloscope, comprising:
   an analog to digital (A/D) converter for digitizing a data signal;
   an acquisition unit, for acquiring at least a portion of a digitized data signal in response to a trigger signal;
   a phase locked loop (PLL), implemented in hardware for recovering a clock signal from said data signal;
   a controller for controlling said PLL and storing said recovered clock signals in a memory; and
   a display device for contemporaneously displaying said data signal and said clock signal; wherein said controller control one of a mask diagram generation program operative to segment said acquired sample stream into a plurality of selected bit sequences according to said recovered clock signal and store said bit sequences in a display memory, or and eye diagram generation program operative to segment said acquired sample stream into a plurality of frames according to recovered clock signal and store frames in said a display memory.
7. The oscilloscope of claim 6, wherein a difference between said data signal and corresponding recovered clock signal is displayed on said display device as a Time Interval Error (TIE) function.

* * * * *